United States Patent
Jeong et al.

(10) Patent No.: US 8,830,000 B2
(45) Date of Patent: Sep. 9, 2014

(54) MULTI-BAND AMPLIFIER AND METHOD OF AMPLIFYING MULTI-BAND

(75) Inventors: Moon Suk Jeong, Gyeonggi-do (KR); Nam Heung Kim, Gyeonggi-do (KR); Hyun Paek, Gyeonggi-do (KR); Su Kyong Kim, Chungcheongnam-do (KR); Shin Hwan Hwang, Gyeonggi-do (KR); Yoo Sam Na, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/598,512

(22) Filed: Aug. 29, 2012

(65) Prior Publication Data

US 2013/0069722 A1  Mar. 21, 2013

(30) Foreign Application Priority Data

Sep. 19, 2011 (KR) .................. 10-2011-0094138

(51) Int. Cl.
*H03F 1/22* (2006.01)

(52) U.S. Cl.
USPC .......................................... 330/311; 330/126

(58) Field of Classification Search
USPC .............................. 330/124 R, 126, 295, 311
See application file for complete search history.

(56) References Cited

U.S. PATENT DOCUMENTS

| 6,496,708 | B1 | 12/2002 | Chan et al. | |
|---|---|---|---|---|
| 7,023,272 | B2 * | 4/2006 | Hung et al. | 330/126 |
| 7,167,044 | B2 * | 1/2007 | Li et al. | 330/126 |
| 8,018,288 | B2 * | 9/2011 | Duster et al. | 330/311 |
| 8,175,566 | B2 * | 5/2012 | Tasic et al. | 330/124 R |
| 8,242,841 | B2 * | 8/2012 | Zhang | 330/302 |
| 8,482,348 | B2 * | 7/2013 | Pinarello et al. | 330/311 |
| 2005/0176399 | A1 * | 8/2005 | Aparin | 330/250 |
| 2010/0311378 | A1 * | 12/2010 | Tasic et al. | 330/124 R |

FOREIGN PATENT DOCUMENTS

| KR | 10-2006-0061750 A | 6/2006 |
|---|---|---|
| KR | 10-2006-0070796 A | 6/2006 |
| KR | 10-2008-0109301 A | 12/2008 |
| KR | 10-0882103 B1 | 1/2009 |

\* cited by examiner

*Primary Examiner* — Khanh V Nguyen
(74) *Attorney, Agent, or Firm* — Bracewell & Giuliani LLP; Brad Y. Chin

(57) ABSTRACT

Provided is a multi-band amplifier and a method of amplifying a multi-band. The multi-band amplifier includes a wireless signal input terminal into which a first frequency band signal and a second frequency band signal are input, a first impedance matching part connected to the wireless signal input terminal and configured to match an input impedance in a first frequency band, a second impedance matching part connected to the wireless signal input terminal and configured to match an input impedance in a second frequency band, a common source amplifier to which the first impedance matching part and the second impedance matching part, and a common gate amplifier connected to the common source amplifier. Accordingly, performance degradation can be reduced in comparison with a conventional amplifier, broadband amplification as well as narrow band amplification can be performed, and an amplification gain can be adjusted.

13 Claims, 2 Drawing Sheets

MULTI-BAND AMPLIFIER AND METHOD OF AMPLIFYING MULTI-BAND

CROSS-REFERENCE TO RELATED APPLICATIONS

This application claims the benefit of Korean Patent Application No. 10-211-0094138 filed with the Korea Intellectual Property Office on Sep. 19, 2011, the disclosure of which is incorporated herein by reference.

BACKGROUND OF THE INVENTION

1. Field of the Invention

The present invention relates to a multi-band amplifier and a method of amplifying a multi-band.

2. Description of the Related Art

In recent times, as wireless communication techniques are developed, various kinds of wireless communication equipment is introduced into daily lives.

As the various kinds of wireless communication equipment is introduced, a larger number of frequency bands are used in wireless communication, and thus, necessity of combining various communication equipment having different frequency bands has been proposed.

According to such necessity, a multi mode-multi band (MMMB) technique capable of supporting various applications using a single chip has been proposed in various ways. In addition, since frequency bands may be frequently different according to countries even in the same application, research on a multi-band or wide band technique capable of simultaneously supporting various frequency bands is being widely performed.

Patent Document 1 discloses a multi-band amplifier in which a passive device is applied to suppress current consumption without a separate output terminal buffer.

However, since the amplifier proposed in Patent Document 1 includes an active circuit and a passive circuit, which are optimized at different frequencies, the entire performance of the amplifier is degraded as a difference between the optimized frequencies increases. In other words, as a difference between a resonance point of a filter part and a resonance point of an amplifying part is increased, the performance is degraded.

RELATED ART DOCUMENT

Patent Document

Patent Document 1: Korean Patent Registration No: 10-0882103

SUMMARY OF THE INVENTION

The present invention has been invented in order to overcome the above-described problems and it is, therefore, an object of the present invention to provide a multi-band amplifier and a method of amplifying a multi-band that are capable of processing wireless signals of various frequency bands.

In addition, it is an object of the present invention to provide a multi-band amplifier and a method of amplifying a multi-band that are capable of adjusting an amplification gain in amplifying wireless signals of various frequency bands.

In accordance with one aspect of the present invention to achieve the object, there is provided a multi-band amplifier including: a wireless signal input terminal into which a first frequency band signal and a second frequency band signal are input; a first impedance matching part connected to the wireless signal input terminal and configured to match an input impedance in a first frequency band; a second impedance matching part connected to the wireless signal input terminal and configured to match an input impedance in a second frequency band; a common source amplifier to which the first impedance matching part and the second impedance matching part; and a common gate amplifier connected to the common source amplifier.

Here, the common source amplifier may include a first transistor in which the first impedance matching part is connected to a control terminal, a first terminal is connected to a ground terminal, and a second terminal is connected to the common gate amplifier; and a second transistor in which the second impedance matching part is connected to a control terminal, a first terminal is connected to a ground terminal, and a second terminal is connected to the common gate amplifier.

In addition, the common source amplifier may include a first transistor in which the first impedance matching part is connected to a control terminal, a first terminal is connected to a ground terminal, a second terminal is connected to the common gate amplifier, and a first control signal is applied to the control terminal; and a second transistor in which the second impedance matching part is connected to a control terminal, a first terminal is connected to a ground terminal, a second terminal is connected to the common gate amplifier, and a second control signal is applied to the control terminal.

Further, the common gate amplifier may be a third transistor in which a first common gate control signal is applied to a control terminal, a first terminal is connected to the common source amplifier, and a second terminal is connected to an output terminal.

Furthermore, the multi-band amplifier may further include an output impedance matching part installed between the second terminal of the common gate amplifier and the output terminal.

Here, the output impedance matching part may include a fourth capacitor installed between the second terminal of the common gate amplifier and the output terminal.

In addition, the output impedance matching part may include a fifth inductor and a fifth capacitor connected between a drive power supply and the second terminal of the common gate amplifier.

Further, the output impedance matching part may include a fourth capacitor installed between the second terminal of the common gate amplifier and the output terminal; and a fifth inductor and a fifth capacitor serially or parallelly connected to each other between a drive power supply and the second terminal of the common gate amplifier.

In accordance with another aspect of the present invention to achieve the object, there is provided a multi-band amplifier including: a wireless signal input terminal into which a first frequency band signal and a second frequency band signal are input; a first impedance matching part connected to the wireless signal input terminal and configured to match an input impedance in a first frequency band; a second impedance matching part connected to the wireless signal input terminal and configured to match an input impedance in a second frequency band; a first cascode amplifier constituted by a first common source amplifier to which the first impedance matching part and the second impedance matching part are connected, and a first common gate amplifier connected to the first common source amplifier and including a third transistor to which a first common gate control signal is input into a control terminal; and a second cascode amplifier constituted by a second common source amplifier to which the first impedance matching part and the second impedance matching part are connected, and a second common gate amplifier connected to the second common source amplifier and including a sixth transistor to which a second common gate control signal is input into a control terminal.

Here, the first common source amplifier may include a first transistor in which the first impedance matching part is connected to a control terminal, a first terminal is connected to a ground terminal, and a second terminal is connected to the first common gate amplifier; and a second transistor in which the second impedance matching part is connected to a control terminal, a first terminal is connected to a ground terminal, and a second terminal is connected to the first common gate amplifier, and the second common source amplifier may include a fourth transistor in which the first impedance matching part is connected to a control terminal, a first terminal is connected to a ground terminal, and a second terminal is connected to the second common gate amplifier; and a fifth transistor in which the second impedance matching part is connected to a control terminal, a first terminal is connected to a ground terminal, and a second terminal is connected to the second common gate amplifier.

In addition, a first control signal may be applied to the control terminals of the first transistor and the fourth transistor, and a second control signal may be applied to the control terminals of the second transistor and the fifth transistor.

Further, the first terminal of the third transistor may be connected to the first common source amplifier and the second terminal may be connected to an output terminal, and the first terminal of the sixth transistor may be connected to the second common source amplifier and the second terminal may be connected to an output terminal.

Furthermore, the multi-band amplifier may further include an output impedance matching part installed between the second terminal of the third transistor and the output terminal and between the second terminal of the sixth transistor and the output terminal.

In accordance with still another aspect of the present invention to achieve the object, there is provided a multi-band amplifier including: a first transistor configured to amplify a first frequency band signal according to a first control signal; a second transistor configured to amplify a second frequency band signal according to a second control signal; and a first common gate amplifier having one end to which a second terminal of the first transistor and a second terminal of the second transistor are connected, and the other end connected to an output terminal.

Here, the multi-band amplifier may further include a fourth transistor configured to amplify a first frequency band signal according to a first control signal; a fifth transistor configured to amplify a second frequency band signal according to a second control signal; and a second common gate amplifier having one end to which a second terminal of the fourth transistor and a second terminal of the fifth transistor are connected, and the other end connected to an output terminal.

In addition, a first common gate control signal may be applied to a control terminal of the first common gate amplifier, and a second common gate control signal may be applied to a control terminal of the second common gate amplifier.

In accordance with still another aspect of the present invention to achieve the object, there is provided a method of amplifying a multi-band using a multi-band amplifier including: a first transistor configured to amplify a first frequency band signal according to a first control signal; a second transistor configured to amplify a second frequency band signal according to a second control signal; and a first common gate amplifier having one end to which a second terminal of the first transistor and a second terminal of the second transistor are connected, and the other end connected to an output terminal, the method comprising: adjusting the first control signal and the second control signal and selectively amplifying any one of amplifying the first frequency band signal only, amplifying the second frequency band signal only, and simultaneously amplifying the first frequency band signal and the second frequency band signal.

In accordance with still another aspect of the present invention to achieve the object, there is provided a method of amplifying a multi-band using a multi-band amplifier including: a first transistor configured to amplify a first frequency band signal according to a first control signal; a second transistor configured to amplify a second frequency band signal according to a second control signal; a first common gate amplifier in which a first common gate control signal is applied to a control terminal, a second terminal of the first transistor and a second terminal of the second transistor are connected to one end, and the other end is connected to an output terminal; a fourth transistor configured to amplify a first frequency band signal according to a first control signal; a fifth transistor configured to amplify a second frequency band signal according to a second control signal; and a second common gate amplifier in which a second common gate control signal is applied to a control terminal, a second terminal of the fourth transistor and a second terminal of the fifth transistor are connected to one end, and the other end is connected to an output terminal, the method comprising: adjusting the first control signal and the second control signal and selectively amplifying any one of amplifying the first frequency band signal only, amplifying the second frequency band signal only, and simultaneously amplifying the first frequency band signal and the second frequency band signal.

Here, an amplification gain may be adjusted by adjusting the first common gate control signal and the second common gate control signal.

In accordance with still another aspect of the present invention to achieve the object, there is provided a multi-band amplifier including: a wireless signal input terminal into which a first frequency band signal and a second frequency band signal are input; a first impedance matching part connected to the wireless signal input terminal and configured to match an input impedance in a first frequency band; a second impedance matching part connected to the wireless signal input terminal and configured to match an input impedance in a second frequency band; a first transistor having a control terminal to which the first impedance matching part is connected and a first control signal is applied, and a first terminal which is grounded; a second transistor having a control terminal to which the second impedance matching part is connected and a second control signal is applied, and a first terminal which is grounded; and a third transistor having a control terminal to which a first common gate control signal is applied, a first terminal connected to the second terminals of the first transistor and the second transistor, and a second terminal connected to a driving power supply and an output terminal.

Here, the multi-band amplifier may further include a fourth capacitor installed between the second terminal of the third transistor and the output terminal; and a fifth inductor and a fifth capacitor serially or parallelly to each other between the driving power supply and the second terminal of the third transistor.

In addition, the multi-band amplifier may further include a fourth transistor having a control terminal to which the first impedance matching part is connected and a first control signal is applied, and a first terminal which is grounded; a fifth transistor having a control terminal to which the second impedance matching part is connected and a second control signal is applied, and a first terminal which is grounded; and a sixth transistor having a control terminal to which a second common gate control signal is applied, a first terminal connected to the second terminals of the fourth transistor and the fifth transistor, and a second terminal connected to the driving power supply and the output terminal.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
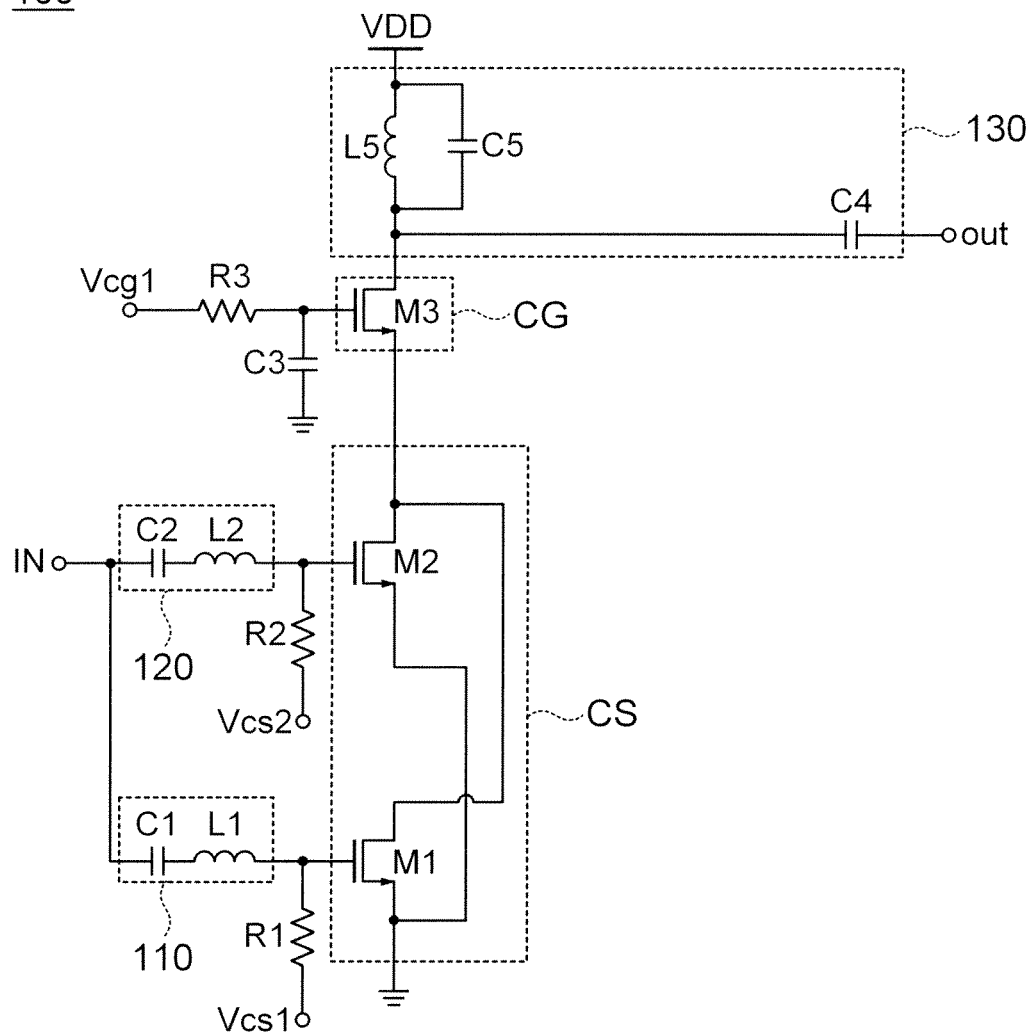
FIG. 1 is a view schematically showing a multi-band amplifier in accordance with an exemplary embodiment of the present invention.

The following embodiments are provided as examples to fully convey the spirit of the invention to those skilled in the art. Therefore, the present invention should not be construed as limited to the embodiments set forth herein and may be embodied in different forms. And, the size and the thickness of an apparatus may be overdrawn in the drawings for the convenience of explanation. The same components are represented by the same reference numerals hereinafter.

Terms used herein are provided for explaining embodiments of the present invention, not limiting the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, motions, and/or devices, but do not preclude the presence or addition of one or more other components, motions, and/or devices thereof.

Hereinafter, configurations and operational effects of the present invention will be described in detail with reference to the accompanying drawings.

FIG. 1 is a view schematically showing a multi-band amplifier 100 in accordance with an exemplary embodiment of the present invention.

Referring to FIG. 1, the multi-band amplifier 100 in accordance with an exemplary embodiment of the present invention generally includes an input impedance matching part, a cascode amplifier, and an output impedance matching part 130.

The input impedance matching part, which is constituted by an inductor L and a capacitor C to perform impedance matching of an input wireless signal, may be implemented by various filters such as a low pass filter, a high pass filter, a band pass filter, and so on.

Meanwhile, the multi-band amplifier 100 in accordance with an exemplary embodiment of the present invention is provided to amplify at least two frequency band signals. Accordingly, the input impedance matching part may include a plurality of input impedance matching parts configured to match input impedances of different frequency band signals.

While FIG. 1 illustrates a first impedance matching part 110 constituted by a first capacitor C1 and a first inductor L1, and a second impedance matching part 120 constituted by a second capacitor C2 and a second inductor L2, the present invention is not limited thereto.

The cascode amplifier is constituted by a common source amplifier CS and a common gate amplifier CG.

Here, the multi-band amplifier 100 in accordance with an exemplary embodiment of the present invention divides the common source amplifier CS into two transistors to amplifier different frequency bands, improving amplification characteristics according to frequency bands and implementing a broadband amplification function.

Specifically describing, the first impedance matching part 110 is connected to a control terminal of a first transistor M1, and the second impedance matching part 120 is connected to a control terminal of a second transistor M2.

Here, the first transistor M1 and the second transistor M2 shares first and second terminals thereof.

Meanwhile, the first terminal is connected to a ground terminal, and the second terminal is connected to the common gate amplifier CG.

In addition, the first transistor M1 receives a first control signal Vcs1 to perform amplification of a first frequency band signal, and the second transistor M2 receives a second control signal Vcs2 to perform amplification of a second frequency band signal.

Accordingly, when the first control signal Vcs1 is an on signal and the second control signal Vcs2 is an off signal, only the first frequency band signal is amplified, and when the second control signal Vcs2 is the on signal and the first control signal Vcs1 is the off signal, only the second frequency band signal is amplified.

Further, when both of the first control signal Vcs1 and the second control signal Vcs2 are the on signals, since both of the first frequency band signal and the second frequency band signal are amplified, the amplifier may be used as a broadband amplifier.

Figure 3:
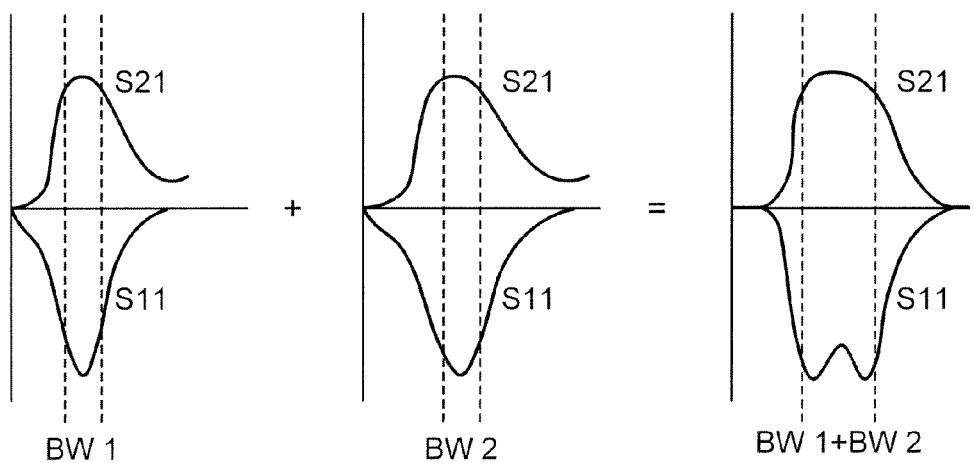
FIG. 3 is a view for explaining a broadband processing principle of the multi-band amplifier in accordance with an exemplary embodiment of the present invention.

FIG. 3 is a view for explaining a broadband processing principle of the multi-band amplifier 100 in accordance with an exemplary embodiment of the present invention. Referring to FIG. 3, it will be appreciated that the multi-band amplifier 100 in accordance with an exemplary embodiment of the present invention can process both of the first frequency band and the second frequency band, i.e., broadband processing is possible.

Meanwhile, the common gate amplifier CG applies a first common gate control signal Vcg1 to the control terminal, the first terminal is connected to the second terminal of the first transistor M1 and the second transistor M2, and the second terminal may be implemented by a third transistor M3 connected to the output terminal.

Here, a third capacitor C3 is connected to the control terminal of the third transistor M3 to prevent a leakage signal of the output from being transmitted as the input, improving isolation characteristics of the input and output.

In addition, an output impedance matching part 130 may be further included between the third transistor M3 and the output terminal.

The output impedance matching part 130 may be implemented by a fourth capacitor C4, a fifth capacitor C5, a fifth inductor L5, and so on.

Here, the fourth capacitor C4 may be a coupling capacitor configured to transmit a signal to the output terminal.

In addition, the fifth inductor L5 and the fifth capacitor C5 may be connected to a drive power supply VDD at one ends thereof, and connected to a second terminal of the third transistor M3 at the other ends, simultaneously applying the power supply to the amplifier and matching the output impedance.

Figure 2:
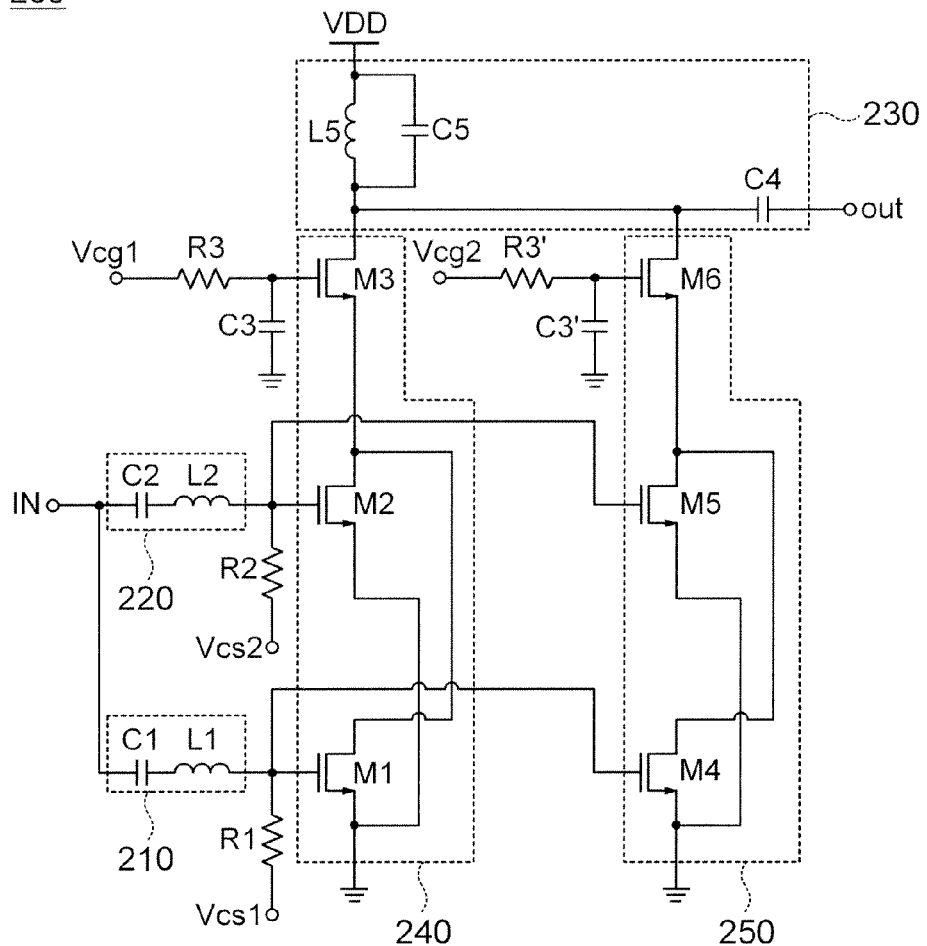
FIG. 2 is a view schematically showing a multi-band amplifier in accordance with another exemplary embodiment of the present invention.

FIG. 2 is a view schematically showing a multi-band amplifier 200 in accordance with another exemplary embodiment of the present invention.

Referring to FIG. 2, the multi-band amplifier 200 in accordance with another exemplary embodiment of the present invention may be constituted by parallelly connecting a first cascode amplifier 240 and a second cascode amplifier 250 to an output terminal.

Here, the first cascode amplifier 240 may include a first common source amplifier and a first common gate amplifier, and the second cascode amplifier 250 may include a second common source amplifier and a second common gate amplifier.

Specifically describing, the first cascode amplifier 240 may include a first common source amplifier constituted by a first transistor M1 and a second transistor M2, and a first common gate amplifier constituted by a third transistor M3.

In addition, the second cascode amplifier 250 may include a second common source amplifier constituted by a fourth transistor M4 and a fifth transistor M5, and a second common gate amplifier constituted by a sixth transistor M6.

Here, the first transistor M1 and the fourth transistor M4 are connected to the first impedance matching part 210 via control terminals to receive the first control signal Vcs1, performing an amplification operation of a first frequency band signal.

In addition, the second transistor M2 and the fifth transistor M5 are connected to the second impedance matching part 220 via control terminals to receive the second control signal Vcs2, performing an amplification operation of a second frequency band signal.

Meanwhile, a first common gate control signal Vcg1 is applied to the third transistor M3, and a second common gate control signal Vcg2 is applied to the sixth transistor M6.

Accordingly, when any one signal of the first common gate control signal Vcg1 and the second common gate control signal Vcg2 is an on signal and the other signal is an off signal, the amplifier 200 has the same configuration as the multi-band amplifier 100 to perform a narrow-band amplification or broadband amplification function using the same principle as described above.

In addition, amplification characteristics of the first cascode amplifier 240 and amplification characteristics of the second cascode amplifier 250 may be varied by differentiating characteristics of each transistor M.

Accordingly, even when any one of the first common gate control signal Vcg1 and the second common gate control signal Vcg2 is the on signal, since the amplification characteristics are different from each other, an amplification gain may be adjusted.

Further, when both of the first common gate control signal Vcg1 and the second common gate control signal Vcg2 is the on signal, the amplification characteristics may be maximized.

Therefore, the multi-band amplifier 200 in accordance with another exemplary embodiment of the present invention may be utilized as the narrow-band amplifier configured to amplify the first frequency band signal or the second frequency band signal to adjust the amplification gain.

Furthermore, in widely utilizing the amplifier as the broadband amplifier over the first frequency band and the second frequency band, the amplification gain thereof may be adjusted.

Embodiments of the invention have been discussed above with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are numerous modifications and variations of the invention that are too numerous to be listed but that all fit within the scope of the invention.

As can be seen from the foregoing, the multi-band amplifier and the method of amplifying a multi-band in accordance with an exemplary embodiment of the present invention provides useful effects capable of reducing performance degradation in comparison with the conventional amplifier in amplifying signals of various frequency bands, and enabling broadband amplification as well as narrow-band amplification.

In addition, the multi-band amplifier and the method of amplifying a multi-band in accordance with another exemplary embodiment of the present invention provides useful effects capable of easily adjusting the amplification gain in addition to the above effects.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A multi-band amplifier comprising:
    a wireless signal input terminal into which a first frequency band signal and a second frequency band signal are input;
    a first impedance matching part connected to the wireless signal input terminal and configured to match an input impedance in a first frequency band;
    a second impedance matching part connected to the wireless signal input terminal and configured to match an input impedance in a second frequency band;
    a first cascode amplifier constituted by a first common source amplifier to which the first impedance matching part and the second impedance matching part are connected, and a first common gate amplifier connected to the first common source amplifier and including a third transistor to which a first common gate control signal is input into a control terminal; and
    a second cascode amplifier constituted by a second common source amplifier to which the first impedance matching part and the second impedance matching part are connected, and a second common gate amplifier connected to the second common source amplifier and including a sixth transistor to which a second common gate control signal is input into a control terminal.

2. The multi-band amplifier according to claim 1, wherein the first common source amplifier comprises:

a first transistor in which the first impedance matching part is connected to a control terminal, a first terminal is connected to a ground terminal, and a second terminal is connected to the first common gate amplifier; and a second transistor in which the second impedance matching part is connected to a control terminal, a first terminal is connected to a ground terminal, and a second terminal is connected to the first common gate amplifier, the second common source amplifier comprises:

a fourth transistor in which the first impedance matching part is connected to a control terminal, a first terminal is connected to a ground terminal, and a second terminal is connected to the second common gate amplifier; and a fifth transistor in which the second impedance matching part is connected to a control terminal, a first terminal is connected to a ground terminal, and a second terminal is connected to the second common gate amplifier.

3. The multi-hand amplifier according to claim 2, wherein a first control signal is applied to the control terminals of the first transistor and the fourth transistor, and a second control signal is applied to the control terminals of the second transistor and the fifth transistor.

4. The multi-band amplifier according to claim 1, wherein the first terminal of the third transistor is connected to the first common source amplifier and the second terminal is connected to an output terminal, and the first terminal of the sixth transistor is connected to the second common source amplifier and the second terminal is connected to an output terminal.

5. The multi-band amplifier according to claim 4, further comprising an output impedance matching part installed between the second terminal of the third transistor and the output terminal and between the second terminal of the sixth transistor and the output terminal.

6. The multi-band amplifier according to claim 5, wherein the output impedance matching part comprises a capacitor installed between the second terminal of the common gate amplifier and the output terminal.

7. The multi-band amplifier according to claim 5, wherein the output impedance matching part comprises an inductor and a capacitor connected between a driving power supply and the second terminal of the common gate amplifier.

8. The multi-band amplifier according to claim 5, wherein the output impedance matching part comprised:

a first capacitor installed between the second terminal of the common gate amplifier and the output terminal; and an inductor and a second capacitor serially or parallelly connected between a driving power supply and the second terminal of the common gate amplifier.

9. A multi-band amplifier comprising:

a first transistor configured to amplify a first frequency band signal according to a first control signal;

a second transistor configured to amplifier a second frequency band signal according to a second control signal;

a first common gate amplifier having one end to which a second terminal of the first transistor and a second terminal of the second transistor are connected, and the other end connected to an output terminal;

a third transistor configured to amplify the first frequency band signal according to the first control signal;

a fourth transistor configured to amplify the second frequency band signal according to the second control signal; and a second common gate amplifier having one end to which a second terminal of the third transistor and a second terminal of the fourth transistor are connected, and the other end connected to the output terminal.

10. The multi-band amplifier according to claim 9, wherein a first common gate control signal is applied to a control terminal of the first common gate amplifier, and a second common gate control signal is applied to a control terminal of the second common gate amplifier.

11. A method of amplifying a multi-band using a multi-band amplifier comprising:

a first transistor configured to amplify a first frequency band signal according to a first control signal;

a second transistor configured to amplify a second frequency band signal according to a second control signal;

a first common gate amplifier in which a first common gate control signal is applied to a control terminal, a second terminal of the first transistor and a second terminal of the second transistor are connected to one end, and the other end is connected to an output terminal;

a third transistor configured to amplify the first frequency band signal according to the first control signal;

a fourth transistor configured to amplify the second frequency band signal according to the second control signal; and a second common gate amplifier in which a second common gate control signal is applied to a second control terminal, a second terminal of the third transistor and a second terminal of the fourth transistor are connected to one end, and the other end is connected to the output terminal, the method comprising:

amplifying the first frequency band signal only by turning on the first transistor and turning off the second transistor, or amplifying the second frequency band signal only by turning on the second transistor and turning off the first transistor, or simultaneously amplifying the first frequency band signal and the second frequency band signal by turning on the first transistor and the second transistor.

12. The method according to claim 11, wherein an amplification gain is adjusted by turning on at least one of the first common gate amplifier and the second common gate amplifier.

13. A multi-band amplifier comprising:

a wireless signal input terminal into which a first frequency band signal and a second frequency band signal are input;

a first impedance matching part connected to the wireless signal input terminal and configured to match an input impedance in a first frequency band;

a second impedance matching part connected to the wireless signal input terminal and configured to match an input impedance in a second frequency band;

a first transistor having a control terminal to which the first impedance matching part is connected and a first control signal is applied, and a first terminal which is grounded;

a second transistor having a control terminal to which the second impedance matching part is connected and a second control signal is applied, a first terminal which is grounded;

a third transistor having a control terminal to which a first common gate control signal is applied, a first terminal connected to the second terminals of the first transistor of the first transistor and the second transistor, and a second terminal connected to a driving power supply and an output terminal;

a fourth transistor having a control terminal to which the first impedance matching part is connected and the first control signal is applied, and a first terminal which is grounded;

a fifth transistor having a control terminal to which the second impedance matching part is connected and a second control signal is applied, and a first terminal which is grounded; and a sixth transistor having a control terminal to which a second common gate control signal is applied, a first terminal connected to the second terminals of the fourth transistor and the fifth transistor, and a second terminal connected to the driving power supply and the output terminal.

* * * * *